US012677694B2

(12) United States Patent
Liu et al.

(10) Patent No.: US 12,677,694 B2
(45) Date of Patent: Jul. 7, 2026

(54) MECHANICAL SUPPORT FOR A TALL OFFSET DIE STACK

(71) Applicant: Sandisk Technologies, Inc., Milpitas, CA (US)

(72) Inventors: Yangming Liu, Shanghai (CN); Shenghua Huang, Shanghai (CN); Bo Yang, Dublin, CA (US); Ning Ye, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 957 days.

(21) Appl. No.: 17/829,719

(22) Filed: Jun. 1, 2022

(65) Prior Publication Data
US 2023/0395446 A1     Dec. 7, 2023

(51) Int. Cl.
H01L 23/24          (2006.01)
H10W 70/65          (2026.01)
(Continued)

(52) U.S. Cl.
CPC ........... H10W 76/47 (2026.01); H10W 70/65 (2026.01); H10W 74/016 (2026.01); H10W 74/117 (2026.01); H10W 90/00 (2026.01); H10W 90/701 (2026.01); H10W 46/00 (2026.01); H10W 90/24 (2026.01); H10W 90/752 (2026.01); H10W 90/754 (2026.01)

(58) Field of Classification Search
CPC ... H01L 23/24; H01L 21/565; H01L 23/3128; H01L 23/49816; H01L 23/49838; H01L 24/48; H01L 25/0652; H01L 25/0657;

H01L 2224/48148; H01L 2224/48229; H01L 2225/06506; H01L 2225/0651; H01L 2225/06562; H01L 2225/06593; H01L 2924/1438; H01L 2924/37001; H01L 21/56; H01L 23/5383; H01L 2225/06586; H01L 24/45; H01L 24/49; H01L 24/85; H10W 76/47; H10W 70/65; H10W 74/016; H10W 74/117; H10W 90/00; H10W 90/701; H10W 46/00; H10W 90/24; H10W 90/752; H10W 90/754; H10W 72/075; H10W 72/50; H10W 70/611; H10W 70/685; H10W 74/01; H10W 90/291

See application file for complete search history.

(56) References Cited

U.S. PATENT DOCUMENTS

| | | | |
|---|---|---|---|
| 9,899,347 B1 | 2/2018 | Mostovoy et al. | |
| 2009/0039524 A1 | 2/2009 | Odegard et al. | |

(Continued)

*Primary Examiner* — Cuong B Nguyen
(74) *Attorney, Agent, or Firm* — Michael Best & Friedrich LLP

(57) ABSTRACT

A semiconductor device including one or more support structures for supporting a semiconductor-die stack having a region that overhangs a substrate. In an example embodiment, the support structures may be implemented using suitably shaped pieces of relatively thick round or ribbon wire attached to metal pads on the substrate. During the encapsulation operation, the one or more support structures may counteract a bending force applied to the semiconductor-die stack by a flow of the molding compound. At least some embodiments may beneficially be used, e.g., to enable high-yield fabrication of devices having sixteen or more stacked memory dies.

14 Claims, 7 Drawing Sheets

(51) Int. Cl.

| | | |
|---|---|---|
| *H10W 74/01* | (2026.01) | |
| *H10W 74/10* | (2026.01) | |
| *H10W 76/47* | (2026.01) | |
| *H10W 90/00* | (2026.01) | |
| *H10W 46/00* | (2026.01) | |
| *H10W 90/24* | (2026.01) | |

(56)               References Cited

U.S. PATENT DOCUMENTS

| | | | |
|---|---|---|---|
| 2010/0044861 A1 | 2/2010 | Chiu et al. | |
| 2011/0089575 A1* | 4/2011 | Lee | H01L 23/495 257/777 |
| 2018/0114776 A1* | 4/2018 | Han | H01L 25/0652 |
| 2019/0035705 A1* | 1/2019 | Mao | H10W 76/40 |
| 2020/0105637 A1* | 4/2020 | Choi | H01L 24/73 |
| 2021/0407967 A1* | 12/2021 | Cui | H01L 24/73 |
| 2023/0111207 A1* | 4/2023 | Chung | H01L 25/0657 257/690 |

* cited by examiner

MECHANICAL SUPPORT FOR A TALL OFFSET DIE STACK

FIELD

This application relates generally to assembly of integrated circuits (ICs), and more particularly but not exclusively, to methods and apparatus for supporting an overhanging region of stacked dies.

BACKGROUND

This section introduces aspects that may help facilitate a better understanding of the disclosure. Accordingly, the statements of this section are to be read in this light and are not to be understood as admissions about what is in the prior art or what is not in the prior art.

One method directed at reducing the physical size of a multi-die IC package includes stacking constituent dies on top of one another. When individual stacked dies are relatively thin, the corresponding die stack may be flexible in at least some portions thereof. In some cases, significant forces might be applied to the flexible portions of the die stack during IC packaging, which may disadvantageously cause such portions to deform, detach, or break.

SUMMARY

Disclosed herein are various embodiments of a semiconductor device including one or more support structures for supporting on a substrate the overhanging region of a semiconductor-die stack. In an example embodiment, the support structures may be implemented using suitably shaped pieces of relatively thick round or ribbon wire attached to metal pads on the substrate. During the encapsulation operation, the one or more support structures may counteract a bending force applied to the semiconductor-die stack by a flow of the molding compound. At least some embodiments may beneficially be used, e.g., to enable high-yield fabrication of nonvolatile-memory devices having sixteen or more stacked memory dies.

According to an example embodiment, provided is a semiconductor device, comprising: a substrate having a first main surface and an opposing second main surface; a vertical stack of semiconductor dies attached to the first main surface, the semiconductor dies being horizontally offset with respect to one another, the vertical stack having first and second stepped surfaces, the first stepped surface overhanging a first area of the first main surface of the substrate; a plurality of first bond wires electrically connecting the semiconductor dies one to another and to the first main surface of the substrate; one or more support structures attached to the first main surface of the substrate, each of the support structures having at least a respective portion thereof along the first stepped surface and vertically between the first area and the first stepped surface; and a molding compound encapsulating the semiconductor dies, the first bond wires, the one or more support structures, and at least the first area of the first main surface of the substrate.

According to another example embodiment, provided is a manufacturing method, comprising: attaching one or more support structures to a first main surface of a substrate; forming a vertical stack of semiconductor dies on the first main surface, the semiconductor dies being horizontally offset with respect to one another, the vertical stack having first and second stepped surfaces, the forming of the vertical stack being performed such that the first stepped surface overhangs one or more respective portions of the one or more support structures; electrically connecting the semiconductor dies one to another and to the substrate with first bond wires; and encapsulating the semiconductor dies, the one or more support structures, the first bond wires, and at least a portion of the first main surface in a molding compound, with the one or more support structures counteracting a bending force applied to the vertical stack by a flow of the molding compound.

According to yet another example embodiment, provided is a semiconductor device made using a manufacturing method, the manufacturing method comprising: attaching one or more support structures to a first main surface of a substrate; forming a vertical stack of semiconductor dies on the first main surface, the semiconductor dies being horizontally offset with respect to one another, the vertical stack having first and second stepped surfaces, the forming of the vertical stack being performed such that the first stepped surface overhangs one or more respective portions of the one or more support structures; electrically connecting the semiconductor dies one to another and to the substrate with first bond wires; and encapsulating the semiconductor dies, the one or more support structures, the first bond wires, and at least a portion of the first main surface in a molding compound, with the one or more support structures counteracting a bending force applied to the vertical stack by a flow of the molding compound.

DETAILED DESCRIPTION

In a typical IC-fabrication process, dies (chips) are produced in relatively large batches using wafers of silicon or other suitable material(s). Electrical and optical circuits can be gradually created on a wafer using a multi-step sequence of photolithographic and chemical processing steps. Such a wafer may then be cut ("diced") into many pieces (chips, dies), with at least some of the individual chips containing a respective copy of the circuit that is being fabricated. An individual functional die can be appropriately packaged prior to being incorporated into a larger circuit or be left non-packaged.

As used herein, the term "stack" refers to an orderly arrangement of packaged or non-packaged dies in which main planes of the stacked dies face and are near each other.

The facing dies or chips may be electrically connected, e.g., using patterned conducting (such as metal) layers, ball-grid arrays, solder bumps, bond wires, etc. In some such embodiments, the dies or chips of a stack can be mounted on a mechanical carrier in an orientation in which the main planes of the stacked dies are parallel to each other and/or to the main plane of the mechanical carrier. In some such embodiments, one of the dies or chips of the stack may function as the mechanical carrier. In some embodiments, individual ICs of the stack may include any combination of one or more respective substrates, one or more redistribution layers (RDLs), one or more interposers, one or more laminate plates, etc.

Herein, a "main plane" of an object, such as a die, a substrate, or an IC, is a plane parallel to a substantially planar surface thereof that has about the largest area among exterior surfaces of the object. This substantially planar surface may be referred to as a main surface. The exterior surfaces of the object that have one relatively large size, e.g., length, but are of much smaller area, e.g., less than one half of the main-surface area, are typically referred to as the edges of the object.

Herein, the term "vertical" refers to a direction that is approximately orthogonal to a main plane of a die or of the corresponding substrate or carrier. The term "horizontal" refers to a direction that is approximately parallel to a main plane of a die or of the corresponding substrate or carrier.

Figure 1:
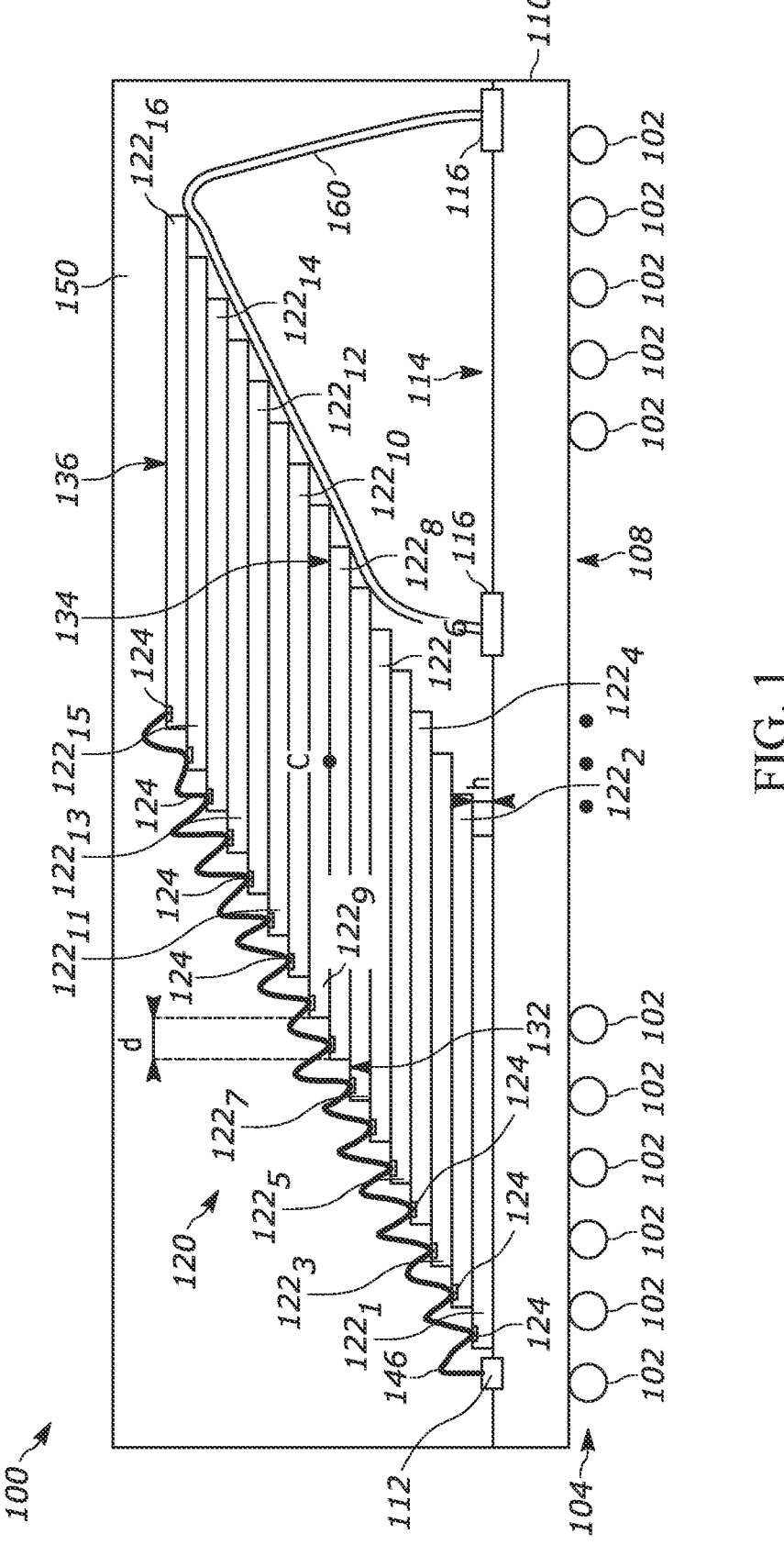
FIG. 1 is a schematic side view illustrating a semiconductor device according to an example embodiment.

FIG. 1 is a schematic side view illustrating a semiconductor device 100 according to an example embodiment. Device 100 comprises a substrate 110 and a die stack 120 electrically connected and attached to a first (illustratively upper) main surface 114 of substrate 110. An opposing second (illustratively lower) main surface 108 of substrate 110 has a plurality of solder balls 102 attached thereto, e.g., in a grid pattern, thereby providing a ball-grid array (BGA) 104. In an example embodiment, substrate 110 has a plurality of conducting paths therein (e.g., see FIG. 3). Some of such conducting paths are configured to electrically connect the first and second main surfaces 108, 114 in accordance with an intended pattern and/or layout. These electrical connections are used, inter alia, to properly electrically connect die stack 120 to different solder balls 102 of the BGA 104.

Die stack 120 is illustratively shown as having sixteen individual semiconductor dies $122_k$, which are labeled in FIG. 1 using the reference numerals $122_1$-$122_{16}$. In an alternative embodiment, die stack 120 may have a different (from 16) number of semiconductor dies $122_k$. In some embodiments, semiconductor dies $122_1$-$122_{16}$ may be nominally identical, within the fabrication-process variances. In a possible embodiment, a semiconductor die $122_k$ may, for example, be a non-volatile memory (NVM) die, such a NAND flash memory die or other suitable type of memory die.

Semiconductor dies $122_1$-$122_{16}$ are stacked atop each other in an offset, stepped configuration, as illustrated in FIG. 1. Different adjacent dies $122_k$ may be fixedly attached to each other, e.g., using a die attach film (DAF) or another suitable attachment material. In some embodiments, the DAF may be cured after its application to create a relatively strong (e.g., permanent) bond between the adjacent dies $122_k$. Semiconductor die $122_1$ may be similarly attached to surface 114 of substrate 110. The offset, stepped configuration of semiconductor dies $122_1$-$122_{16}$ causes the die stack 120 to have two opposing sloped, stepped surfaces, i.e., a first stepped surface 132 and a second stepped surface 134. Each individual step of the stepped surfaces 132, 134 has a vertical dimension (height) that is approximately equal to the thickness h of the corresponding die $122_k$ and a horizontal dimension or depth d that represents the length of the corresponding horizontal inter-die offset. In an example embodiment, all steps of the stepped surfaces 132, 134 may have approximately the same height and depth. In an alternative embodiment, some steps of the stepped surfaces 132, 134 may have different respective heights and/or depths.

Each semiconductor die $122_k$ includes a respective plurality of small, densely packed contact pads 124 aligned along a leading edge of the die (illustratively, the left edge, in FIG. 1). In the view shown in FIG. 1, only one contact pad 124 per semiconductor die $122_k$ is visible. Only some of such contact pads have numerical labels 124 explicitly shown in FIG. 1 due to the space constraints and for ease of understanding. In an example embodiment, each contact pad 124 may have the size of about 35 μm×35 μm, and adjacent contact pads 124 of the same semiconductor die $122_k$ may be spaced from each other by 50 μm (in the direction orthogonal to the plane of the drawing of FIG. 1). Herein, "μm" stands for micrometer. A person of ordinary skill in the pertinent art will readily understand that the number, size, and spacing of contact pads 124 on a semiconductor die $122_k$ may vary in different embodiments.

Substrate 110 similarly includes a corresponding plurality of contact pads 112 on main surface 114 thereof. Contact pads 112 may be aligned along the leading edge of semiconductor die $122_1$. In the view shown in FIG. 1, only one contact pad 112 of the plurality of such contact pads is visible. The spacing (in the direction orthogonal to the plane of the drawing of FIG. 1) between adjacent contact pads 112 may be the same as or different from the spacing between adjacent contact pads 124. A respective bond wire 146 is connected between each contact pad 112 and the corresponding set of contact pads 124 on semiconductor dies $122_1$-$122_{16}$ as indicated in FIG. 1, thereby creating an electrical connection therebetween. Collectively, the different bond wires 146 may form a bus that can be used, e.g., as an input/output (I/O) interface for die stack 120. In different embodiments, this bus can be an 8-bit bus, a 16-bit bus, or a bus of another suitable bit size.

Die stack 120, surface 114 of substrate 110, bond wires 146 are encapsulated in a molding-compound mass 150 as indicated in FIG. 1. Molding-compound mass 150 may include, for example, solid epoxy resin, phenol resin, fused silica, crystalline silica, carbon black and/or metal hydroxide. Other suitable molding compounds may similarly be used in other embodiments. The molding-compound mass 150 may be applied using various known techniques, such as transfer molding or injection molding.

In the shown embodiment, the horizontal inter-die offset d is such that the vertical projection of the center of mass C of die stack 120 onto main surface 114 of substrate 110 is outside the footprint of semiconductor die $122_1$ thereon. During injection molding, the fluid molding compound (which is later cured to form the solid molding-compound mass 150) may be injected from the top, which may cause a significant uncompensated pressure to be applied to stepped surface 132 and a top surface 136 of die stack 120 for at least some period of time. This uncompensated pressure may result in a significant off-center downwards net force applied to die stack 120. This force may disadvantageously deform, detach, or even break die stack 120.

To prevent such disadvantageous occurrences, semiconductor device 100 includes one or more support structures 160 positioned vertically between main surface 114 of substrate 110 and stepped surface 134 of die stack 120, e.g., as indicated in FIG. 1. In the shown embodiment, an individual support element 160 may comprise a length of "heavy" round wire with the two opposite ends thereof being attached to a corresponding pair of wire-bond pads 116 located on main surface 114 of substrate 110. Herein, the relative term "heavy" is used to indicate that the wire used for a support structure 160 may have a larger diameter than the wire used, e.g., for bond wires 146 or other electrical connections in semiconductor device 100. In an example embodiment, the "heavy" wire can be a copper or aluminum wire with a diameter in the range between 50 μm and 150 μm. When used in a support structure 160, the heavy wire performs a structural function and does not typically carry any useful electrical signal. For example, during injection molding, support structure 160 may stop die stack 120 from bending down by an excessive amount in response to the above-mentioned off-center downwards force, thereby preventing the die stack from being deformed or broken. Once the fluid molding compound has filled the space under stepped surface 134, the fluid's pressure around die stack 120 typically equalizes, which causes the die stack to gradually return back to its substantially undeformed shape before the molding compound is fully cured. Other possible embodiments of support structure 160 capable of performing a similar structural function are described below in reference to FIGS. 5-8. In general, each of one or more support structures 160 may have a respective shape configured to provide an opposing force to the vertical stack, the opposing force reducing or eliminating stress on the vertical stack from a second force caused by encapsulation of the vertical stack.

In various embodiments, the wire of support structure 160 may be shaped such that at least a portion thereof is located in close proximity to stepped surface 134 of die stack 120. In some embodiments, said portion of support structure 160 may be in direct physical contact with die stack 120. In some other embodiments, said portion of support structure 160 may be separated from stepped surface 134 of die stack 120 by a gap (e.g., filled with the molding compound).

Figure 2:
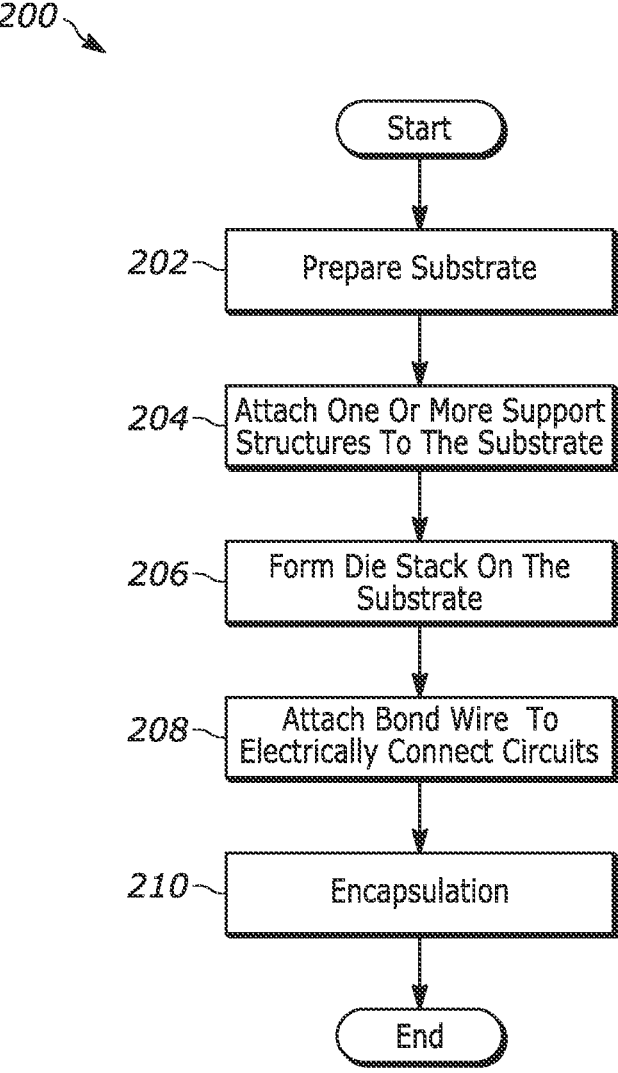
FIG. 2 is a flowchart illustrating a manufacturing method according to various embodiments.

FIG. 2 is a flowchart illustrating a manufacturing method 200 according to various embodiments. At least some embodiments of method 200 can be used to make the semiconductor device 100 (FIG. 1). Other embodiments of method 200 are further detailed below in reference to FIGS. 3-8.

Method 200 includes preparing substrate 110 (in block 202). In an example embodiment, the substrate preparation may include: (i) forming various electrical paths in and on the substrate 110, e.g., by etching appropriate patterns in various metal layers thereof and connecting the patterned metal layers using metal vias, (ii) laminating two or more of substrate layers, (iii) forming various pads on main surface 114, including contact pads 112 and wire-bond pads 116, and (iv) forming solder-ball pads on main surface 108.

Method 200 includes attaching one or more support structures 160 to the prepared substrate 110 (in block 204). In an example embodiment, support structures 160 may be bonded to pads 116 using an automated heavy-gauge-wire bonding tool or ribbon bonding tool. In some embodiments, support structures 160 may be welded to the corresponding pads 116. In some other embodiments, support structures 160 may be glued to the corresponding attach areas on main surface 114 (in block 204).

Method 200 includes forming die stack 120 on substrate 110 (in block 206). For example, die stack 120 may be formed on substrate 110 by sequentially attaching individual dies $122_k$. More specifically, first, semiconductor die $122_1$ may be attached to main surface 114 of substrate 110 in a designated area. Subsequently, other ones of the semiconductor dies $122_k$ may be attached, one by one, with each next semiconductor die $122_k$ being attached in an offset position to the top of the previously attached die $122_{k-1}$. Method 200 may also include one or more instances of curing the DAF layers used to attach the semiconductor dies (in block 206).

Method 200 includes attaching bond wires 146 to electrically connect individual dies $122_k$ of die stack 120 to each other and to substrate 110 (in block 208). In an example embodiment, bond wires 146 may be welded to the corresponding contact pads 112, 124 using an automated wire bonding tool.

Method 200 includes encapsulating die stack 120, bond wires 146, support structure(s) 160, and at least a portion of main surface 114 of substrate 110 in a fluid molding compound (in block 210). During the encapsulation, one or more support structures 160 may beneficially counteract the above-mentioned off-center downwards force, thereby substantially preventing die stack 120 from deforming, detaching, collapsing, or breaking. Method 200 may also include curing the fluid molding compound, thereby forming the solid molding-compound mass 150.

In some embodiments, method 200 may also include attaching solder balls 102 to the corresponding solder-ball pads on main surface 108. In various embodiments, method 200 may be followed by one or more of package marking, package singulation, and final product testing. The above-described sequence of different operations is for illustration purposes, and various embodiments are not limited to this particular sequence.

Figure 3:
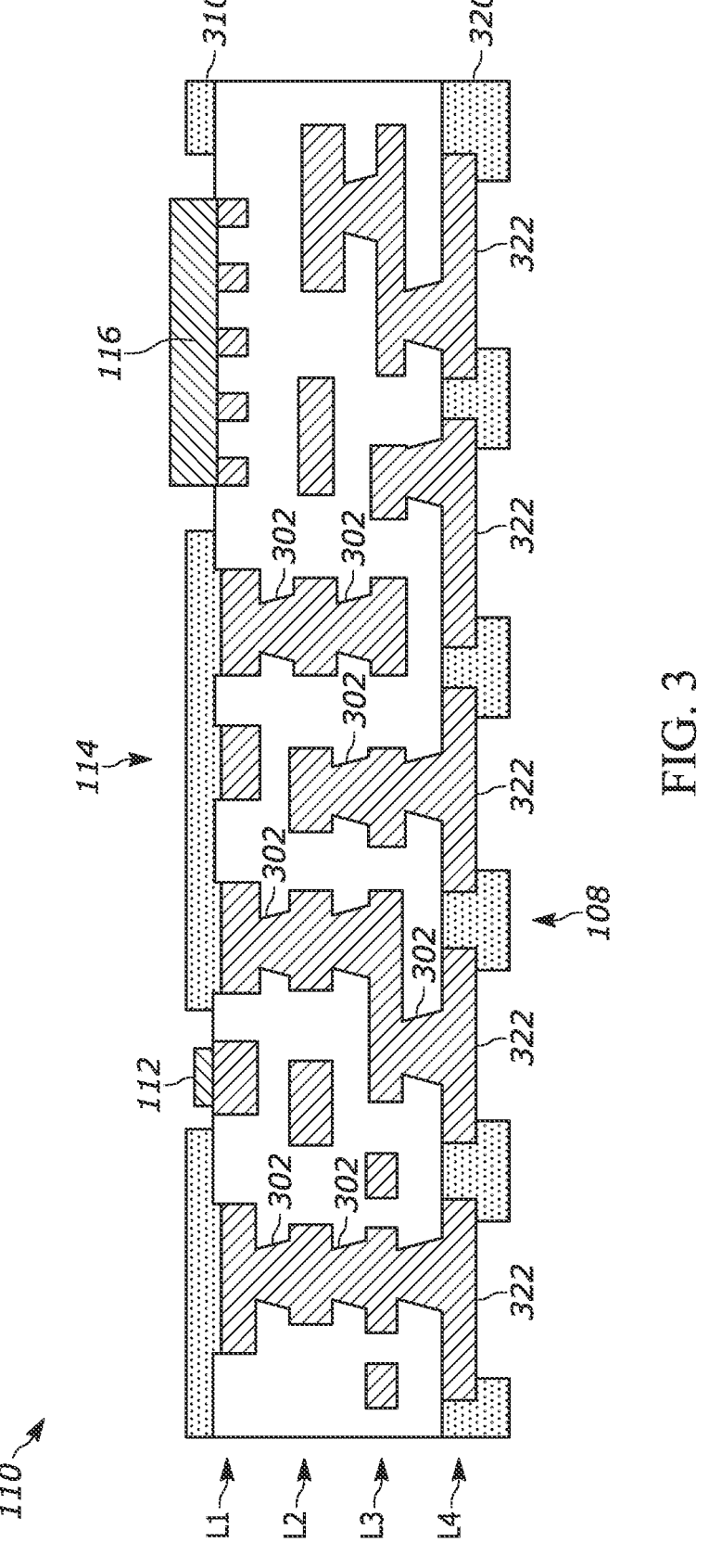
FIG. 3 is a cross-sectional side view illustrating a substrate that can be used in the semiconductor device of FIG. 1 according to an embodiment.

FIG. 3 is a cross-sectional side view illustrating substrate 110 according to an example embodiment. In this particular example, substrate 110 comprises four metal levels, which are labeled L1, L2, L3, and L4, respectively. The metal levels L1-L4 are separated from each other by layers of inter-level dielectric (ILD). Each of the metal levels L1-L4 is patterned to create conducting tracks within the levels. Some conducting tracks of the different metal levels L1-L4 are electrically connected using metal vias 302 formed in different ILD layers. The resulting electrically conducting structure provides the above-mentioned electrically conducting paths through substrate 110.

Parts of main surface 114 of substrate 110 are covered by a layer 310 of solder resist. Metal pads 112 and 116 (only two of which are shown in FIG. 3 for illustration purposes) are in the corresponding openings in the solder-resist layer 310, e.g., as illustrated in FIG. 3. Contact pads 112 are electrically connected to the corresponding electrically conducting paths in substrate 110. In contrast, wire-bond pads 116 may not be connected to such electrically conducting paths, e.g., because support structures 160 do not typically implement an electrical function.

Parts of main surface 108 of substrate 110 are similarly covered by a layer 320 of solder resist. Openings in the solder-resist layer 320 provide access to contact pads 322 to which solder balls 102 can be attached. Depending on the specific embodiment, contact pads 322 may be a part of the metal level L4 or may be separately formed pads that are electrically connected to the metal level L4.

Figure 4:
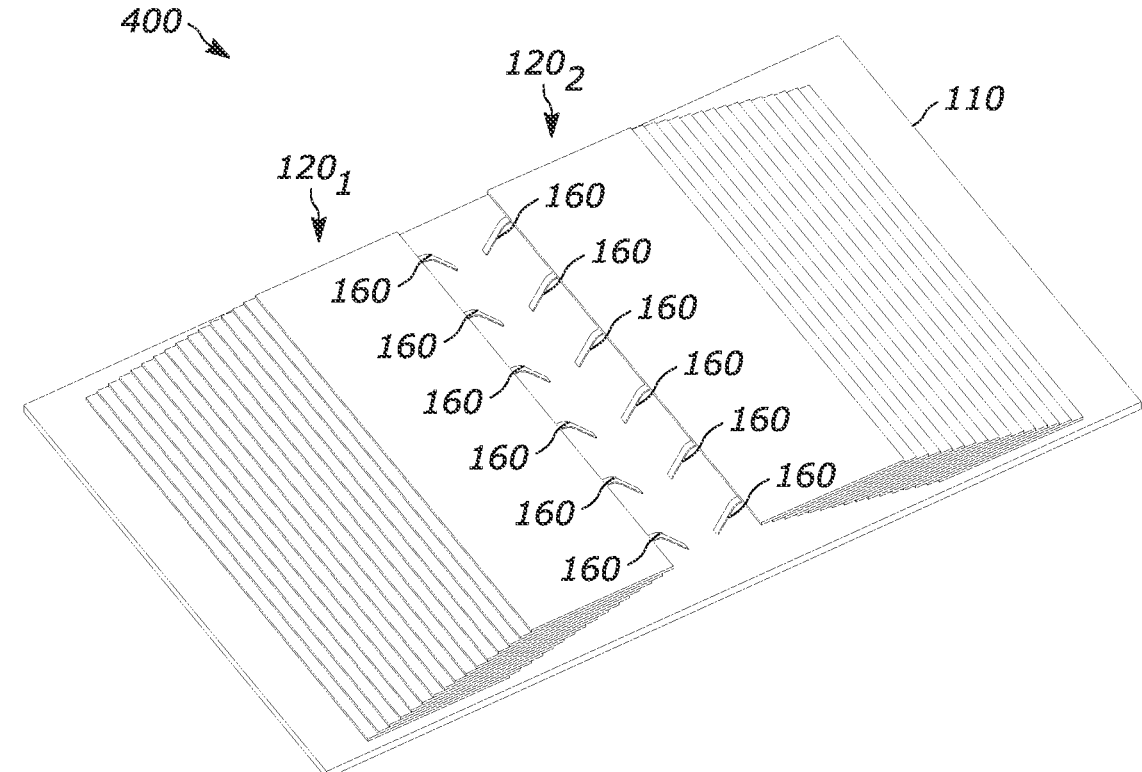
FIG. 4 is a three-dimensional perspective view illustrating a semiconductor device according to another example embodiment.

FIG. 4 is a three-dimensional perspective view illustrating a semiconductor device 400 according to another embodiment. Device 400 is generally analogous to device 100 and may include many of the above-described components and elements. Device 400 differs from device 100 in that device 400 includes two instances (e.g., nominal copies) of die stack 120, which are labeled in FIG. 4 using the reference numerals $120_1$ and $120_2$, respectively. Die stacks $120_1$ and $120_2$ are mounted on the same (common) substrate 110. Substrate 110 has six support structures 160 for die stack $120_1$ and another six support structures 160 for die stack $120_2$. In the shown embodiment, support structures 160 are made of the above-mentioned heavy wire. The orientation of die stack $120_1$ is related to the orientation die stack $120_2$ by a 180-degree rotation about an axis orthogonal to a main plane of substrate 110. In other embodiments, other relative orientations of die stacks $120_1$ and $120_2$ may also be realized.

Figure 5:
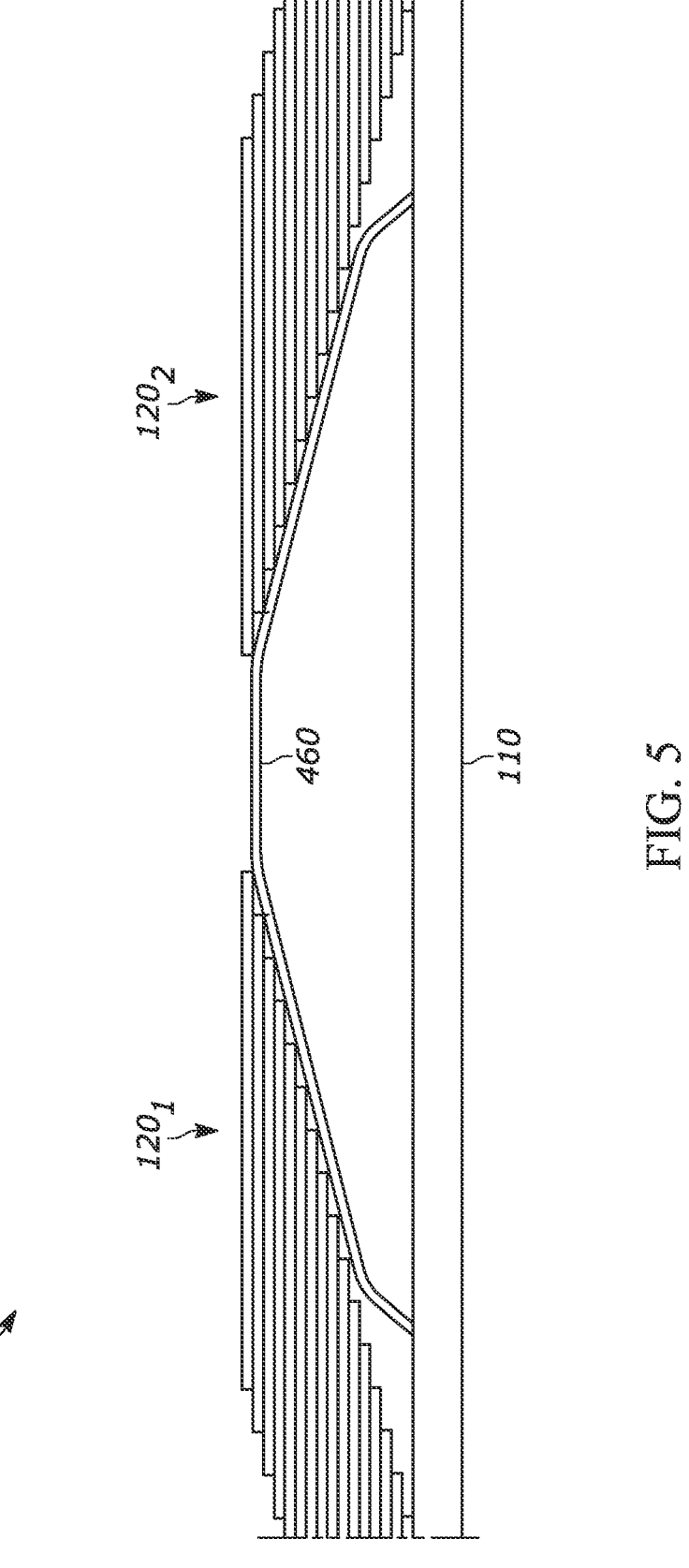
FIG. 5 is a schematic side view illustrating a possible modification of the semiconductor device of FIG. 4 according to yet another example embodiment.

FIG. 5 is a schematic side view illustrating a possible modification of semiconductor device 400 (FIG. 4) according to yet another example embodiment. In this particular example, each pair of facing support structures 160, one of the support structures being at die stack $120_1$ and the other one of the support structures being at die stack $120_2$, are replaced by a corresponding single support structure 460, for a total of six support structures 460. An individual support structure 460 has different portions thereof both next to die stack $120_1$ and to die stack $120_2$, e.g., as indicated in FIG. 5. This particular shape of support structure 460 enables said support structure to support both of die stacks $120_1$ and $120_2$ during the encapsulation operation (in block 210, FIG. 2).

Figure 6:
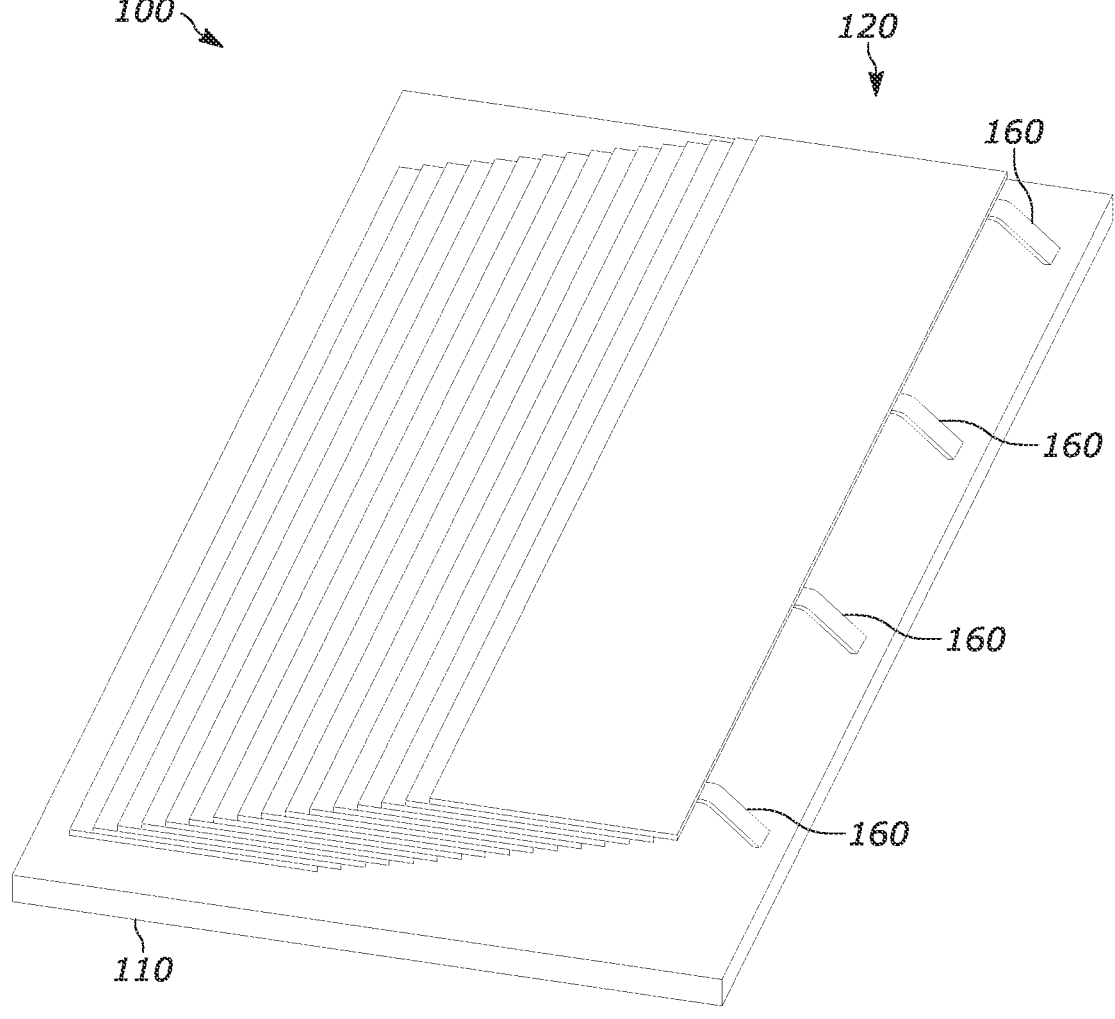
FIG. 6 is a three-dimensional perspective view illustrating a possible modification of the semiconductor device of FIG. 1 according to yet another example embodiment.

FIG. 6 is a three-dimensional perspective view illustrating a possible modification of semiconductor device 100 (FIG. 1) according to another example embodiment. In this particular example, substrate 110 has four support structures 160 attached thereto to support die stack 120 as explained above. Each of the four support structures comprises a respective ribbon bond.

Figure 7:
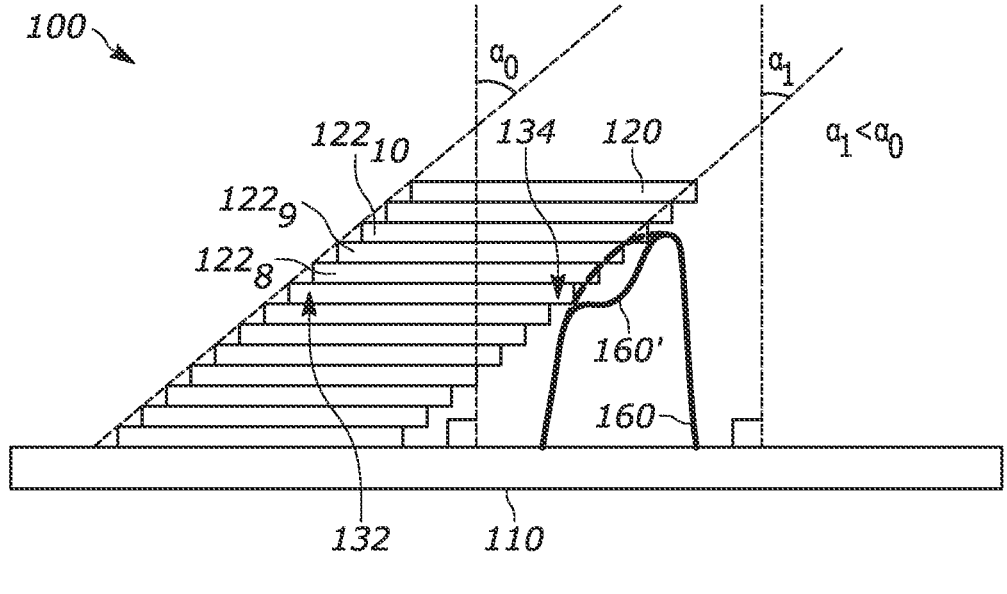
FIGS. 7 and 8 are schematic side views illustrating a range of shapes of the support structures that may be used in different semiconductor devices according to various embodiments.
Figure 8:
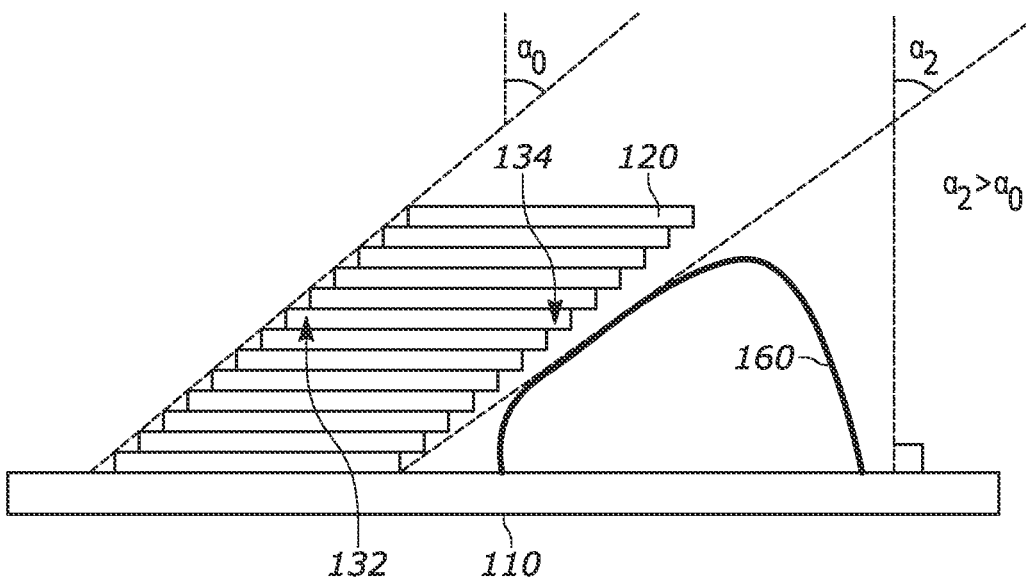

FIGS. 7 and 8 are simplified schematic side views illustrating a range of shapes that can be used for support structures 160 according to various embodiments. For illustration purposes and without any implied limitations, possible shapes of support structures 160 are described below in reference to round-wire-based embodiments of support structures 160. However, the shape-modification concepts applied to the shapes of round-wire-based support structures 160 are also applicable to ribbon-based support structures 160 and other possible support structures 160.

Referring to FIG. 7, a dashed line 160' indicates an original shape of the shown round-wire-based support structure 160 after the attachment operation in block 204 of method 200. Said original shape 160' has a substantially straight (e.g., linear) wire portion oriented at an angle $\alpha_1$ with respect to the surface normal to substrate 110. The angle $\alpha_1$ is smaller than the angle $\alpha_0$ representing the tilt angle of stepped surfaces 132, 134 of die stack 120. In mathematical terms, the angle $\alpha_0$ can be expressed as follows: $\alpha_0 = \arctan(d/h)$, where d and h are the above-described depth and height of the steps of stepped surfaces 132, 134 (also see FIG. 1). In an example embodiment, the difference between the angles $\alpha_0$ and $\alpha_1$ may typically be, e.g., in the range between 0 degrees and 15 degrees.

After the encapsulation operation in block 210 of method 200, the round-wire-based support structure 160 adopts its final shape indicated in FIG. 7 by the corresponding solid line. The shape change from the dashed-line shape 160' to the solid-line shape 160 may typically be caused by the pliability of the wire and by: (i) a force applied to the wire by some individual dies $122_k$ during the die-attach operation in block 206 of method 200 and (ii) a force applied to the wire by the bending of the assembled die stack 120 during the encapsulation operation in block 210 of method 200. In the shown example, semiconductor dies $122_8$, $122_9$, and $122_{10}$ may be responsible for the transfer of force to the wire of the shown support structure 160. As a result, some or all of the dies $122_8$, $122_9$, and $122_{10}$ may be in direct physical contact with the shown support structure 160 in the final product, i.e., the packaged semiconductor device 100 (FIG. 1).

Referring to FIG. 8, in this particular example, the shown support structure 160 has a substantially straight wire portion oriented at an angle as with respect to the surface normal to substrate 110. The angle as is larger than the angle $\alpha_0$. In an example embodiment, the difference between the angles as and $\alpha_0$ may typically be, e.g., in the range between 0 degrees and 15 degrees. The shown support structure 160 is not in direct physical contact with any of the dies of the die stack 120, i.e., there is a non-zero distance between the shown support structure 160 and stepped surface 134 of die stack 120. However, the distance is relatively small such that the above-mentioned off-center downwards force applied to die stack 120 during the encapsulation operation in block 210 of method 200 is capable of bending the die stack down to bring it into direct physical contact with the shown support structure 160, which stops further bending of the die stack. Elastic forces may then return die stack 120 back into the shown position after the off-center downwards force ceases.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

Unless explicitly stated otherwise, each numerical value and range should be interpreted as being approximate as if the word "about" or "approximately" preceded the value or range.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Unless otherwise specified herein, in addition to its plain meaning, the conjunction "if" may also or alternatively be construed to mean "when" or "upon" or "in response to determining" or "in response to detecting," which construal may depend on the corresponding specific context. For example, the phrase "if it is determined" or "if [a stated condition] is detected" may be construed to mean "upon determining" or "in response to determining" or "upon detecting [the stated condition or event]" or "in response to detecting [the stated condition or event]."

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit the embodiments to a specific orientation. For example, height does not imply only a vertical rise limitation, but is used to identify one of the three dimensions of a three-dimensional structure as shown in the figures. Such "height" would be vertical where the dies are horizontal but would be horizontal where the dies are vertical, and so on. Similarly, while the figures show the dies as horizontal layers, such orientation is for descriptive purpose only and not to be construed as a limitation.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. The same type of distinction applies to the use of terms "attached" and "directly attached," as applied to a description of a physical structure. For example, a relatively thin layer of adhesive or other suitable binder can be used to implement such "direct attachment" of the two corresponding components in such physical structure.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

"SUMMARY" in this specification is intended to introduce some example embodiments, with additional embodiments being described in "DETAILED DESCRIPTION" and/or in reference to one or more drawings. "SUMMARY"

is not intended to identify essential elements or features of the claimed subject matter, nor is it intended to limit the scope of the claimed subject matter.

"ABSTRACT" is provided to allow the reader to quickly ascertain the nature of the technical disclosure. It is submitted with the understanding that it will not be used to interpret or limit the scope or meaning of the claims. In addition, in the foregoing "DETAILED DESCRIPTION," it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into "DETAILED DESCRIPTION," with each claim standing on its own as a separately claimed subject matter.

What is claimed is:

1. A semiconductor device, comprising:
a substrate having a first main surface and an opposing second main surface;
a vertical stack of semiconductor dies attached to the first main surface, the semiconductor dies being horizontally offset with respect to one another, the vertical stack having first and second stepped surfaces, the first stepped surface overhanging a first area of the first main surface of the substrate;
a plurality of first bond wires electrically connecting the semiconductor dies one to another and to the first main surface of the substrate;
one or more support structures attached to the first main surface of the substrate, including an individual support structure having at least a respective portion thereof along the first stepped surface and vertically between the first area and the first stepped surface, the respective portion being in direct physical contact with two or more semiconductor dies of the vertical stack; and
a molding compound encapsulating the semiconductor dies, the first bond wires, the one or more support structures, and at least the first area of the first main surface of the substrate,
wherein the individual support structure comprises a respective length of round wire having a first arched shape or a respective length of ribbon wire having a second arched shape; and
wherein the respective length of round wire or the respective length of ribbon wire is in direct physical contact with the two or more semiconductor dies of the vertical stack.

2. The semiconductor device of claim 1, wherein the individual support structure includes a second bond wire attached to the first main surface of the substrate and having a diameter greater than a diameter of the first bond wires.

3. The semiconductor device of claim 1, further comprising a plurality of solder balls attached to the second main surface of the substrate.

4. The semiconductor device of claim 3, wherein the substrate comprises a plurality of electrical paths connecting the plurality of solder balls to the first main surface.

5. The semiconductor device of claim 3, wherein the one or more support structures are not electrically connected to any of the solder balls.

6. The semiconductor device of claim 1,
wherein the one or more support structures include another individual support structure; and wherein the another individual support structure is in direct physical contact with the two or more semiconductor dies of the vertical stack.

7. The semiconductor device of claim 1, wherein each of the one or more support structures has a respective shape configured to counteract a bending force applied to the vertical stack by a flow of a fluid molding compound.

8. The semiconductor device of claim 1, wherein the respective portion is sloped and substantially straight.

9. The semiconductor device of claim 1, wherein a center of mass of the vertical stack is vertically above the first area of the first main surface.

10. The semiconductor device of claim 1, wherein a first one of the semiconductor dies is directly attached to the first main surface; and wherein a vertical projection of a center of mass of the vertical stack onto the first main surface is outside a footprint of the first one of the semiconductor dies.

11. The semiconductor device of claim 1, wherein the vertical stack includes sixteen semiconductor dies.

12. The semiconductor device of claim 1, wherein the semiconductor dies are non-volatile memory dies.

13. The semiconductor device of claim 1, wherein the first stepped surface has eight or more steps.

14. A semiconductor device made using a manufacturing method, the manufacturing method comprising:

attaching one or more support structures to a first main surface of a substrate;

forming a vertical stack of semiconductor dies on the first main surface, the semiconductor dies being horizontally offset with respect to one another, the vertical stack having first and second stepped surfaces, the forming of the vertical stack being performed such that the first stepped surface overhangs one or more respective portions of the one or more support structures;

electrically connecting the semiconductor dies one to another and to the substrate with first bond wires; and encapsulating the semiconductor dies, the one or more support structures, the first bond wires, and at least a portion of the first main surface in a molding compound, with the one or more support structures counteracting a bending force applied to the vertical stack by a flow of the molding compound, wherein the one or more support structures include an individual support structure having at least a respective portion thereof along the first stepped surface and vertically between the first main surface and the first stepped surface, the respective portion being in direct physical contact with two or more semiconductor dies of the vertical stack;

wherein the individual support structure comprises a respective length of round wire having a first arched shape or a respective length of ribbon wire having a second arched shape; and wherein the respective length of round wire or the respective length of ribbon wire is in direct physical contact with the two or more semiconductor dies of the vertical stack.

* * * * *